United States Patent
Vapurcuyan et al.

(10) Patent No.: US 10,163,324 B2
(45) Date of Patent: Dec. 25, 2018

(54) REMOTE BATTERY MONITOR

(71) Applicant: Siemens Industry, Inc., Alpharetta, GA (US)

(72) Inventors: Alan V. Vapurcuyan, Montville, NJ (US); Eugene A. Mastroianni, Paterson, NJ (US); Paul Richard Strelecki, Whitehouse Station, NJ (US)

(73) Assignee: Siemens Industry, Inc., Alpharetta, GA (US)

( * ) Notice: Subject to any disclaimer, the term of this patent is extended or adjusted under 35 U.S.C. 154(b) by 0 days.

(21) Appl. No.: 15/276,555

(22) Filed: Sep. 26, 2016

(65) Prior Publication Data

US 2018/0089983 A1    Mar. 29, 2018

(51) Int. Cl.
| | | |
|---|---|---|
| G08B 21/18 | (2006.01) | |
| G01R 31/36 | (2006.01) | |
| G08B 29/18 | (2006.01) | |
| H01M 10/48 | (2006.01) | |
| G05B 19/042 | (2006.01) | |
| H01M 10/42 | (2006.01) | |

(52) U.S. Cl.
CPC ........... *G08B 21/182* (2013.01); *G01R 31/36* (2013.01); *G01R 31/3606* (2013.01); *G01R 31/3689* (2013.01); *G08B 21/185* (2013.01); *G08B 29/181* (2013.01); *H01M 10/48* (2013.01); *H01M 10/486* (2013.01); *G05B 19/0428* (2013.01); *G05B 2219/2614* (2013.01); *H01M 2010/4278* (2013.01)

(58) Field of Classification Search
CPC ..................................................... H02J 7/0078
USPC ............................................ 340/636.13, 636.1
See application file for complete search history.

(56) References Cited

U.S. PATENT DOCUMENTS

| | | | |
|---|---|---|---|
| 4,207,514 A * | 6/1980 | Klein | H02J 7/0078 320/134 |
| 5,349,282 A | 9/1994 | McClure | |
| 5,352,968 A * | 10/1994 | Reni | G01R 31/362 320/136 |
| 5,528,148 A * | 6/1996 | Rogers | B60L 11/1861 320/137 |
| 6,094,030 A * | 7/2000 | Gunthorpe | H01M 10/425 320/116 |
| 7,474,228 B2 * | 1/2009 | Lockhart | G01R 31/3648 324/433 |
| 7,693,590 B2 | 4/2010 | Nelson | |
| 2004/0178918 A1 * | 9/2004 | Lockhart | G01R 19/16542 340/636.1 |

(Continued)

FOREIGN PATENT DOCUMENTS

| | | |
|---|---|---|
| EP | 0612134 A2 | 8/1994 |
| WO | 2005078673 A1 | 8/2005 |

OTHER PUBLICATIONS

Glenn Alber, "Predicting Battery Performance Using Internal Cell Resistance", Albercorp, Boca Raton, FL, http://www.alber.com/docs/predictbatt.pdf, 8 pages (Jan. 31, 2003).

(Continued)

*Primary Examiner* — Emily C Terrell

(57) ABSTRACT

A remote battery monitor that is configurable based upon the data from the battery and is able to monitor the condition of the battery while the battery is present in a circuit.

21 Claims, 6 Drawing Sheets

(56) References Cited

U.S. PATENT DOCUMENTS

| | | | |
|---|---|---|---|
| 2005/0038614 A1* | 2/2005 | Botts | G01R 31/3606 702/63 |
| 2006/0017582 A1* | 1/2006 | Lockhart | G01R 31/3648 340/636.1 |
| 2010/0182157 A1* | 7/2010 | Shaffer | H04Q 9/00 340/636.13 |
| 2012/0029852 A1* | 2/2012 | Goff | G01R 31/3679 702/63 |
| 2015/0206421 A1 | 7/2015 | Moffa | |

OTHER PUBLICATIONS

PCT International Search Report and Written Opinion of International Searching Authority dated Nov. 27, 2017 corresponding to PCT International Application No. PCT/US2017/048616 filed Aug. 25, 2017.

* cited by examiner

REMOTE BATTERY MONITOR

FIELD OF THE INVENTION

This application relates to the field of building systems and emergency systems and, more particularly, to remote monitoring backup batteries in high availability devices.

BACKGROUND

Building automation systems encompass a wide variety of systems that aid in the monitoring and control of various aspects of building operation. Building automation systems (which may also be referred to herein as "building control systems") include security systems, fire safety systems, lighting systems, and heating, ventilation, and air conditioning ("HVAC") systems. Lighting systems and HVAC systems are sometimes referred to as "environmental control systems" because these systems control the environmental conditions within the building. A single facility may include multiple building automation systems (e.g., a security system, a fire system and an environmental control system). Multiple building automation systems may be arranged separately from one another or as a single system with a plurality of subsystems that are controlled by a common control station or server. The common control station or server may be contained within the building or remote from the building, depending upon the implementation The elements of a building automation system may be widely dispersed throughout a facility or campus. For example, an HVAC system includes temperature sensors and ventilation damper controls as well as other elements that are located in virtually every area of a facility or campus. Similarly, a security system may have intrusion detection, motion sensors and alarm actuators dispersed throughout an entire building or campus. Likewise,fire safety systems include smoke alarms, emergency lighting, and pull stations dispersed throughout the facility or campus. The different areas of a building automation system may have different settings based upon the use and personal likes of people in those areas.

Building automation systems typically have one or more centralized control stations in which data from the system may be monitored, and in which various aspects of system operation may be controlled and/or monitored. The control station typically includes a computer or server having processing equipment, data storage equipment, and a user interface. To allow for monitoring and control of the dispersed control system elements, building automation systems often employ multi-level communication networks to communicate operational and/or alarm information between operating elements, such as sensors and actuators, and the centralized control station.

One example of a building automation system control station is the Apogee® insight® Workstation, available from Siemens Industry, Inc., Building Technologies Division, of Buffalo Grove, Ill. ("Siemens"), which may be used with the Apogee® building automation system, also available from Siemens. In this system, several control stations connected via an Ethernet or another type of network may be distributed throughout one or more building locations, each having the ability to monitor and control system operation.

The typical building automation system (including those utilizing the Apogee® Insight® Workstation) has a plurality of field panels that are in communication with the central control station. While the central control station is generally used to make modifications and/or changes to one or more of the various components of the building automation system, a field panel may also be operative to allow certain modifications and/or changes to one or more parameters of the system. This typically includes changes to parameters such as temperature and lighting, and/or similar parameters.

The central control station and field panels are in communication with various field devices, otherwise known as "points". Field devices are typically in communication with field panels of building automation systems and are operative to measure, monitor, and/or control various building automation system parameters. Example field devices include lights, thermostats, damper actuator, alarms, HVAC devices, sprinkler systems, speakers, door locks, and numerous other field devices as will be recognized by those of skill in the art. These field devices receive control signals from the central control station and/or field panels. Accordingly, building automation systems are able to control various aspects of building operation by controlling the field devices and smart devices by direct control. Large commercial and industrial facilities have numerous field devices that are used for environmental control purposes. These field devices may be referred to herein as "environmental control devices".

Many of the devices in building automation s s mi are becoming smart devices requiring networked communication to operate in addition to traditional high availability devices such as emergency lights and alarm systems. These types of devices and systems need to operate when building power is interrupted. Batteries are typically used to keep devices temporarily operating during a power interruption. While existing building automation systems may allow for smart devices, the remote monitoring of the battery conditions of these systems and devices is limited or non-existent. Degradation of batteries is often not identified until failure occurs during a test of the actually device or system. What is needed in the art is an approach that will address these issues and problems identified above.

SUMMARY

In accordance with one embodiment of the disclosure, there is provided an approach for dynamically configuring a remote battery monitor. The remote battery monitor is able to receive data from a battery, access the World Wide Web to identify and retrieve configuration data for the remote battery monitor. Once configured the remote battery monitor collects operational and battery condition data from the battery or batteries that are being monitored. The operational and battery condition data is transferred to a server or workstation where the data is analyzed and historical data may be accessed. Based upon the analyzed data, alerts and messages may be generated and send in response to the battery condition.

The above described features and advantages, as well as others, will become more readily apparent to those of ordinary skill in the art by reference to the following detailed description and accompanying drawings. While it would be desirable to provide a remote battery approach that provides one or more of these or other advantageous features, the teachings disclosed herein extend to those embodiments which fall within the scope of the appended claims, regardless of whether they accomplish one or more of the above-mentioned advantages.

DESCRIPTION

An example approach is provided for in circuit monitoring a battery in an operating device and reporting/updating the condition of the battery. In the example, a battery in an operating device is monitored and information associated with the battery condition is recorded and reported via the building automation system.

Figure 1:
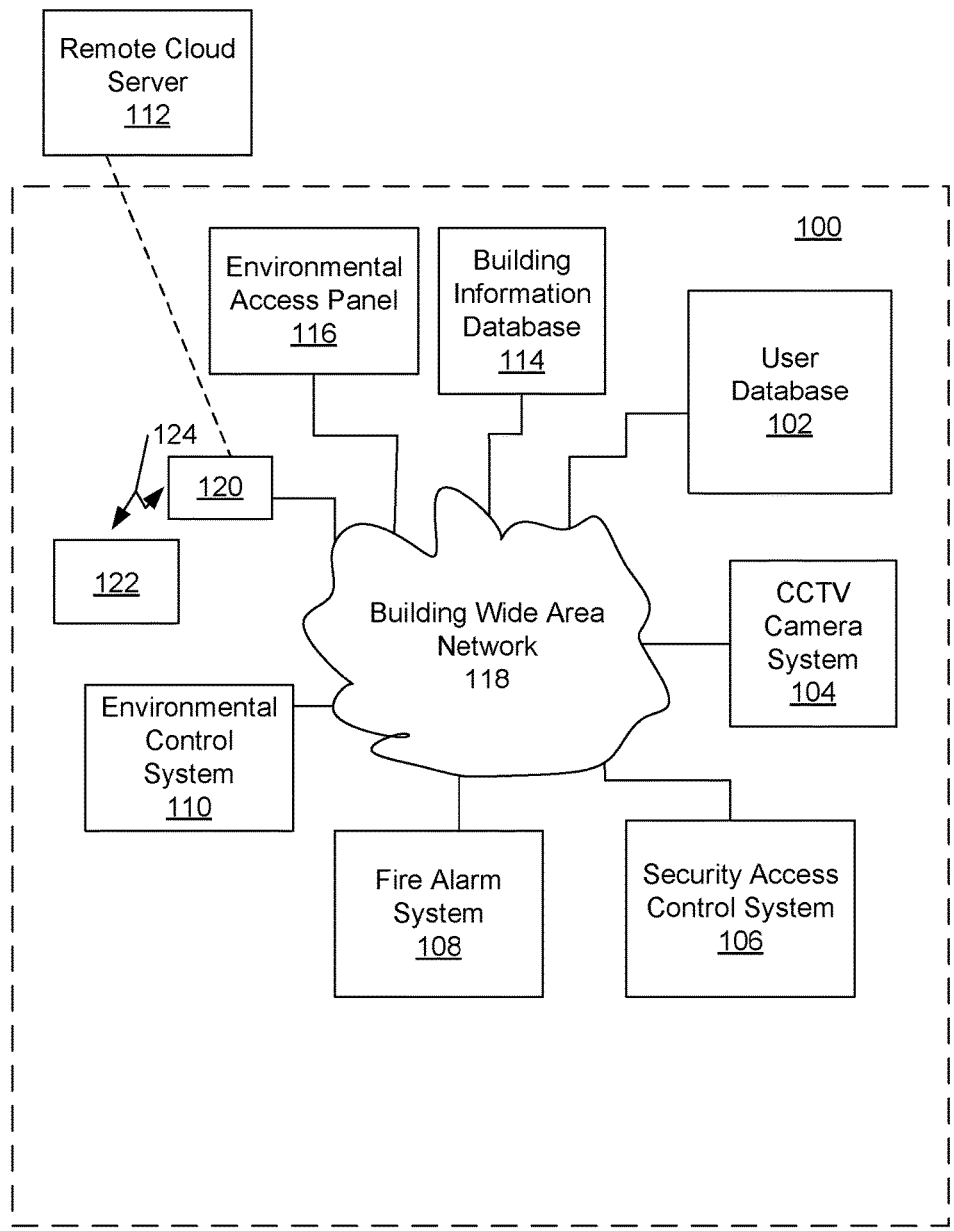
FIG. 1 is an exemplary topology diagram for a building automation system having an environmental control access panel.

With reference to FIG. 1, an exemplary topology diagram for a building automation system 100 approach is shown. The building wide area network 118 includes a plurality of systems and components in wired or wireless communication. Example of some of the systems and components accessible over the wide area network 118 include user database 102, CCTV camera system 104, security access control system 106, fire alarm system 108, environmental control system 110, building information database 114, and environmental access panel 116.

The building automation 100 is depicted as a distributed building system that provides control functions for any one of a plurality of building operations, such as environmental control, security, life or fire safety, industrial control and/or the like. An example of a BAS is the Apogee® building automation system available from Siemens Industry, Inc., Building Technologies Division, of Buffalo Grove, Ill. The Apogee® building automation system allows the setting and/or changing of various controls of the system, generally as provided below. While a brief description of an exemplary BAS is provided in the paragraphs below, it should be appreciated that the building automation system 100 described herein is only an exemplary form or configuration for a building automation system.

The building automation system "BAS" 100 is also shown with a building interface system "BIS" 120 that enables the building automation systems' plurality of systems to communicate wirelessly with the devices connected to the building wide area network 118. For example, a smart device emergency exit sign is able to communicate wirelessly 124 with the BIS 120. The BIS 120 may include access to a data storage device comprising a building information database 114, a user database 102 and be an interface for a remote cloud server 112 that operates and or monitors the building automation system 100. In other implementations, the remote cloud server 112 may be located locally. In yet other implementations, multiple servers may be coupled to the BAS 100 with some located locally and others remote. The servers may be connected directly to the building wide area network 118 via a secure internet connection or to a device, such as BIS 120.

Software for communicating data to the BIS 120 may be stored on smart emergency exit sign 122 and/or the building automation the building information database 114. The BIS 120 enables the control and recording of results from remote testing and of battery performance and condition of devices and systems, such as the smart emergency exit sign 122. As will be explained herein, the remote testing of the batteries occurs preferably while the device or system is operating. For example, it is very undesirable to turn off a fire alarm system 108 in a building to test the backup batteries of that system.

Figure 2:
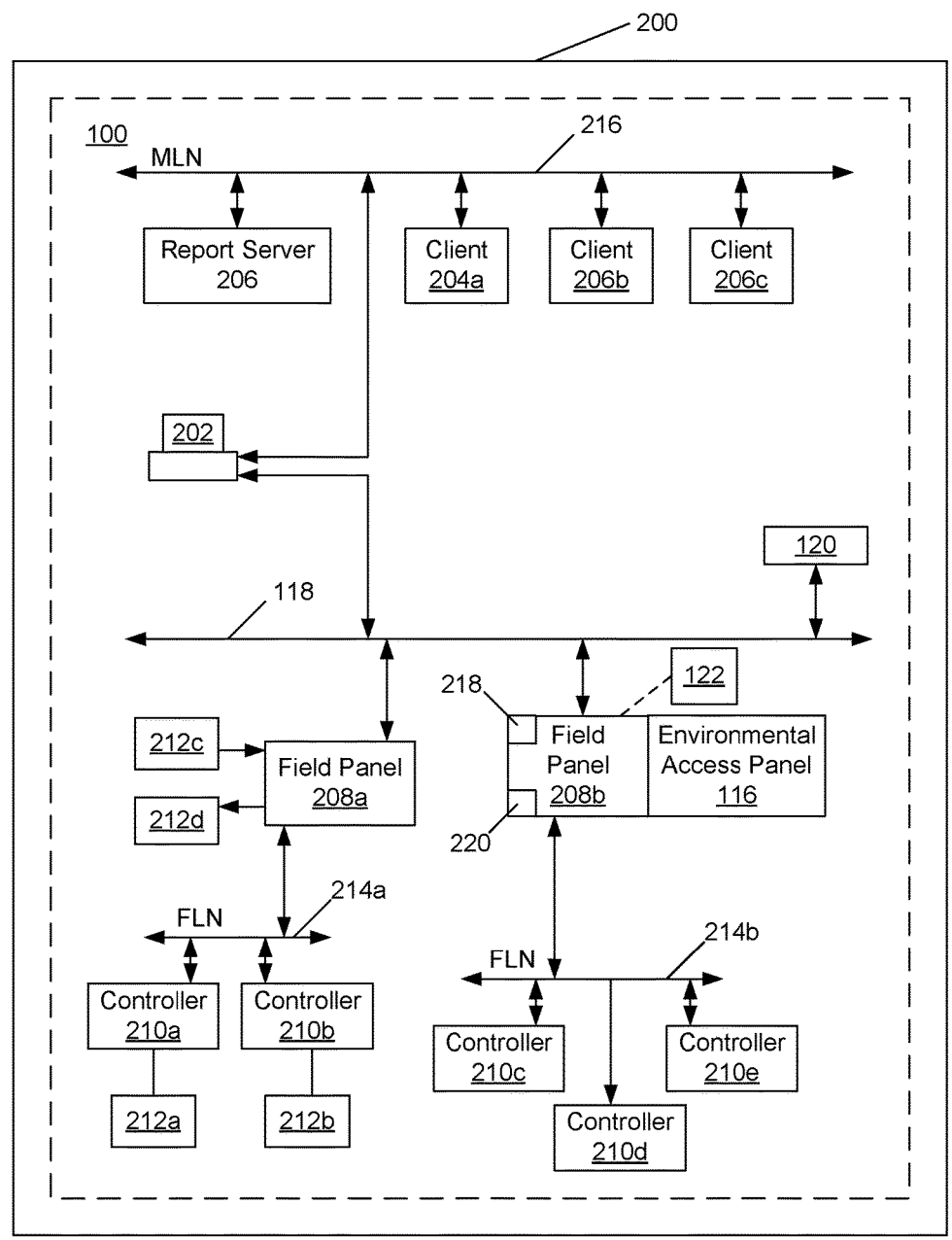
FIG. 2 shows an exemplary block diagram of a building automation system of the building network of FIG. 1.

With particular reference to FIG. 2, the BAS 100 in a building 200 may be implemented with at least one supervisory control system or workstation 202, client workstations 204a-204c, report server 206, a plurality of field panels represented by field panels 208a and 208b, and a plurality of controllers represented by controllers 210a-201e. It will be appreciated, however, that wide varieties of BAS architectures may be employed.

Each of the controllers 210a-210e represents one of a plurality of localized, standard building control subsystems, such as space temperature control subsystems, lighting control subsystems, or the like. Suitable controllers for building control subsystems include, for example, the model TEC (Terminal Equipment Controller) available from Siemens Industry, Inc., Building Technologies Division, of Buffalo Grove, Ill. To carry out control of its associated subsystem, each controller 210a-210e connects to one or more field devices, such as sensors or actuators, shown by way of example in FIG. 2 as the sensor 212a is connected to the controller 210a and the actuator 212b is connected to controller 210b.

Typically, a controller such as the controller 210a affects control of a subsystem based on sensed conditions and desired set point conditions. The controller controls the operation of one or more field devices to attempt to bring the sensed condition to the desired set point condition. By way of example, consider a temperature control subsystem that is controlled by the controller 210a, where the actuator 212b is connected to an air conditioning damper and the sensor 212a is a room temperature sensor. If the sensed temperature as provided by the sensor 212a is not equal to a desired temperature set point, then the controller 210a may further open or close the air conditioning damper via actuator 212b to attempt to bring the temperature closer to the desired set point. It is noted that in the BAS 100, sensor, actuator and set point information may be shared between controllers 210a-210e, the field panels 208a and 208b, the work station 202 and any other elements on or connected to the BAS 100.

To facilitate the sharing of such information, groups of subsystems such as those connected to controllers 210a and 210b are typically organized into floor level networks or field level networks ("FLNs") and generally interface to the field panel 208a. The FLN data network 214a is a low-level data network that may suitably employ any suitable proprietary or open protocol. Subsystems 210c, 210d and 210e along with the field panel 210b are similarly connected via another low-level FLN data network 214b. Again, it should be appreciated that wide varieties of FLN architectures may be employed.

The field panels 208a and 208b are also connected via building wide area network 118 to the workstation 202 and the report server 206. The field panels 208a and 208b thereby coordinate the communication of data and control signals between the subsystems 210a-210e and the supervisory computer 202 and report server 206. In addition, one or more of the field panels 208a and 208b may themselves be in direct communication with and control field devices, such as ventilation damper controllers or the like. To this end, as shown in FIG. 2, the field panel 208a is operably connected to one or more field devices, shown for example as a sensor 212c and an actuator 212d.

The workstation (server in other implementations) 202 provides overall control and monitoring of the BAS 100 and includes a user interface. The workstation 202 further operates as a BAS data server that exchanges data with various elements of the BAS 100. The BAS data server can also exchange data with the report server 206. The BAS data server 202 allows access to the BAS system data by various applications. Such applications may be executed on the workstation 202 or other supervisory computers (not shown).

With continued reference to FIG. 2, the workstation 202 is operative to accept modifications, changes, alterations and/or the like from the user. This is typically accomplished via a user interface of the workstation 202. The user interface may include a keyboard, touchscreen, mouse, or other interface components. The workstation 202 is operable to, among other things, affect or change operational data of the field panels 208a, 208b as well as other components of the BAS 100. The field panels 208a and 208b utilize the data and/or instructions from the workstation 202 to provide control of their respective controllers.

The workstation 202 is also operative to poll or query the field panels 208a and 208b for gathering data. The workstation 202 processes the data received from the field panels 208a and 208b, including trending data. Information and/or data is thus gathered from the field panels 208a and 208b in connection with the polling, query or otherwise, which the workstation 202 stores, logs and/or processes for various uses. To this end, the field panels 208a and 208b are operative to accept modifications, changes, alterations and/or the like from the user. The workstation 202 may also treat smart devices, such as smart device 122 as a field panel for operation and data collection purposes, The workstation 202 also preferably maintains a database associated with each field panel 208a and 208b. The database maintains operational and configuration data for the associated field panel. The report server 206 stores historical data, trending data, error data, system configuration data, graphical data, battery condition data and other BAS system information as appropriate. In other embodiments the building information database 210 and the user database 220 may be stored elsewhere, such as field panel 106b or in the cloud.

The management level network (MLN) 216 may connect other supervisory computers and/or servers, internet gateways, or other network gateways to other external devices, as well as to additional network managers (which in turn connect to more subsystems via additional love level data networks). The MLN 216 may be part of the building wide area network 118 or part of the internet depending upon implementation. The workstation 202 may operate as a supervisory computer that uses the MLN 216 to communicate BAS data to and from other elements on the MLN 216. The MLN 216 may suitably comprise an Ethernet or similar wired network and may employ TCP/IP, BACnet, and/or other protocols that support high speed data communications.

FIG. 2 also shows that the BAS 100 may include a field panel 208b that is shown in FIG. 2 as a housing that holds the building information database 218, the user database 220, and the environmental access panel 116. Further, BIS 120 may be coupled to network 118 and provide a wireless link to smart devices, such as smart device 122. The wireless communication may be wireless internet, such as 802.3g/n, Bluetooth, XBEE, or similar known wireless approaches. In other implementations, smart device 122 may be coupled or networked to a field panel, such as field panel 208b. In yet other implementations, a non-smart device may be coupled to a field panel or other type of controller that provides the "smart" functionality for the non-smart device.

Figure 3:
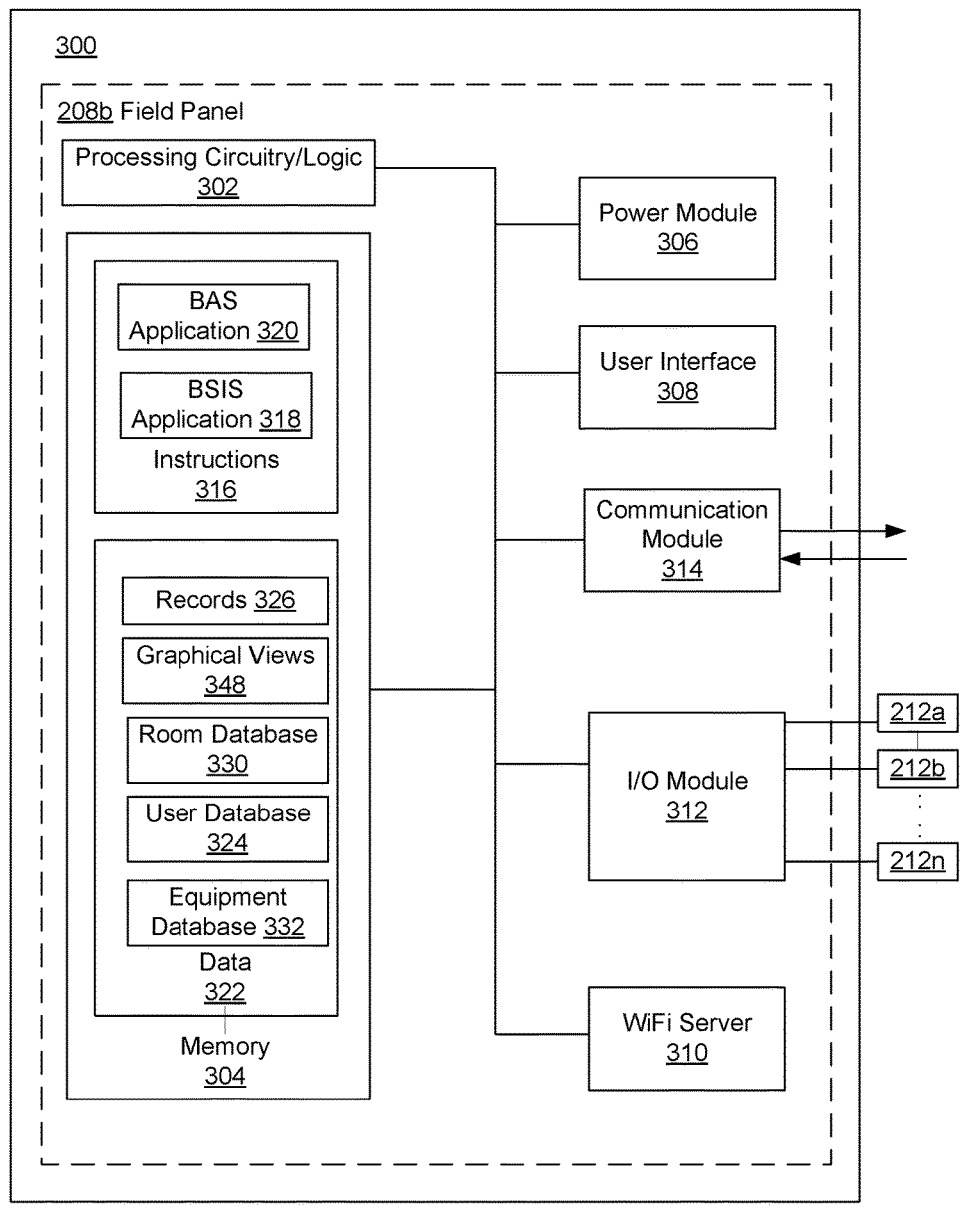
FIG. 3 shows an exemplary internal block diagram of a field panel for the building automation system of FIG. 2.

With reference now to FIG. 3, a block diagram of an exemplary embodiment of the field panel 208b of FIG. 2 is shown. It should be appreciated that the embodiment of the field panel 208b is only an exemplary embodiment of a field panel in a BAS 100. As such, the exemplary embodiment of the field panel 208h of FIG. 3 is a generic representation of all manners or configurations of field panels that are operative in the manner set forth herein.

The field panel 208b of FIG. 3 includes a housing, cabinet, or the like 300 that is configured in a typical manner for a building automation system field panel. The field panel 208b includes processing circuitry/logic 302, memory 304, a power module 306, a user interface 308, an I/O module 312, a BAS network communications module 314, and the WiFi server 310.

The processing circuitry/logic 302 is operative, configured and/or adapted to operate the field panel 208b including the features, functionality, characteristics and/or the like as described herein. To this end, the processing circuitry logic 302 is operably connected to all of the elements of the field panel 208a described below. The processing circuitry/logic 302 is typically under the control of program instructions or programming software or firmware contained in the instructions 316 area of memory 304, explained in further detail below. In addition to storing the instructions 316, the memory also stores data 322 for use by the BAS 100.

The field panel 208b also includes a power module 306 that is operative, adapted and/or configured to supply appropriate electricity to the field panel 208b (i.e., the various components of the field panel). The power module 306 may operate on standard 120 volt AC electricity, but may alternatively operate on other AC voltages or include DC power supplied by a battery or batteries.

An input/output (I/O) module 134 is also provided in the field panel 208b. The I/O module 312 includes one or more input/output circuits that communicate directly with terminal control system devices such as actuators and sensors. Thus, for example, the I/O module 312 includes analog input circuitry for receiving analog sensor signals from the sensor 208a, and includes analog output circuitry for providing analog actuator signals to the actuator 208b. The I/O module 312 typically includes several of such input and output circuits.

The field panel 208b further includes a BAS network communication module 314. The network communication module 314 allows for communication to the controllers 210c and 210e as well as other components on the FLN 214b, and furthermore allows for communication with the workstation 202, other field panels (e.g., field panel 208a) and other components on the wide area network 118. To this end, the communication module 314 includes a first port (which may suitably be a RS-485 standard port circuit) that is connected to the FLN 214b, and a second port (which may also be an RS-485 standard port circuit) that is connected to the wide area network 118.

The field panel 208b may be accessed locally. To facilitate local access, the field panel 208b includes an interactive user interface 308. Using user interface 308, the user may control the collection of data from devices such as sensor 212a and actuator 212b. The user interface 308 of the field panel 208b includes devices that display data and receive input data. The user interface 308 may also suitably include an LCD type screen or the like, and a keypad. The user interface 308 is operative, configured and/or adapted to both alter and show information regarding the field panel 208b, such as status information, and/or other data pertaining to the operation, function and/or modifications or changes to the field panel 208b.

As mentioned above, the memory 304 includes various programs that may be executed by the processing circuitry/logic 302 n particular, the memory 304 of FIG. 3 includes a BAS application 320 and a remote battery monitoring application 318. The BAS application 320 includes conventional applications configured to control the field panel 208b of the BAS 100 in order to control and monitor various field devices 212a-n of the BAS 100. Accordingly, execution of the BAS application 320 by the processing circuitry/logic 302 results in control signals being sent to the field devices 212a-n via the I/O module 312 of the field panel 208b. Execution of the BAS application 320 also results in the processor 302 receiving status signals and other data signals from various field devices 212a-n, and storage of associated data in the memory 304. In one embodiment, the BAS application 320 may be provided by the Apogee® Insight® BAS control software commercially available from Siemens industry, Inc. or another BAS control software.

In addition to the instructions 316, the memory 304 may also include data 322. The data 322 includes records 326, graphical views 348, a room database 350, a user database 324, and an equipment database 332. The records 326 include current and historical data stored by the field panel 208b in association with control and operation of the field devices 212a-n. For example, the records 326 may include current and historical temperature information in a particular room of the building 300, as provided by a thermistor or other temperature sensor within the room. The records 320 in the memory may also include various set points and control data for the field devices 212a-d, which may be pre-installed in memory 304 or provided by the user through the user interface 308. The records 326 may also include other information related to the control and operation of the 100 HAS and remote battery monitoring application 146, including statistical, logging, licensing, condition, and historical information The graphical views 348 provide various screen arrangements to be displayed to the user via the user interface 308. The room database 330 may include data related to the layout of the building 300 and contain information about what devices are located in the different rooms a building 300 or campus. This room database 330 includes a unique identifier for each room or area within the building (e.g., room "12345"). In addition to the unique identifier data, the room database 330 may include other information about particular rooms or areas within the building 300. For example, the room database 330 may include information about field devices located within the room or area, particular equipment (e.g., research equipment, manufacturing equipment, or HVAC equipment) positioned within the room or area.

The user database 324 may include data related to human users who have access to the BAS 100. Accordingly, the user database 324 may include a unique identifier for each human user (e.g., user "12345") and a user profile associated with that user. In other implementations, each room or area may have a profile that has one or more users associated with it.

The equipment database 332 may include data related to various pieces of equipment within the building 300. The equipment may include field devices associated with the BAS 100 or other equipment that is positioned within the building 300. For example, the equipment database 332 may include information relating to smart devices such as emergency light 122 having a backup battery. The equipment database 332 maintains a unique identifier for each piece of equipment (e.g., equipment "12345") and data associated with that equipment. For example, the emergency light 122 would have a unique identifier assigned to it along with data associated with the characteristics of the emergency light 122 including location, manufacturer, type of battery, voltage of battery, age of battery, condition of battery, last time battery was tested, last time power event occurred.

Figure 4:
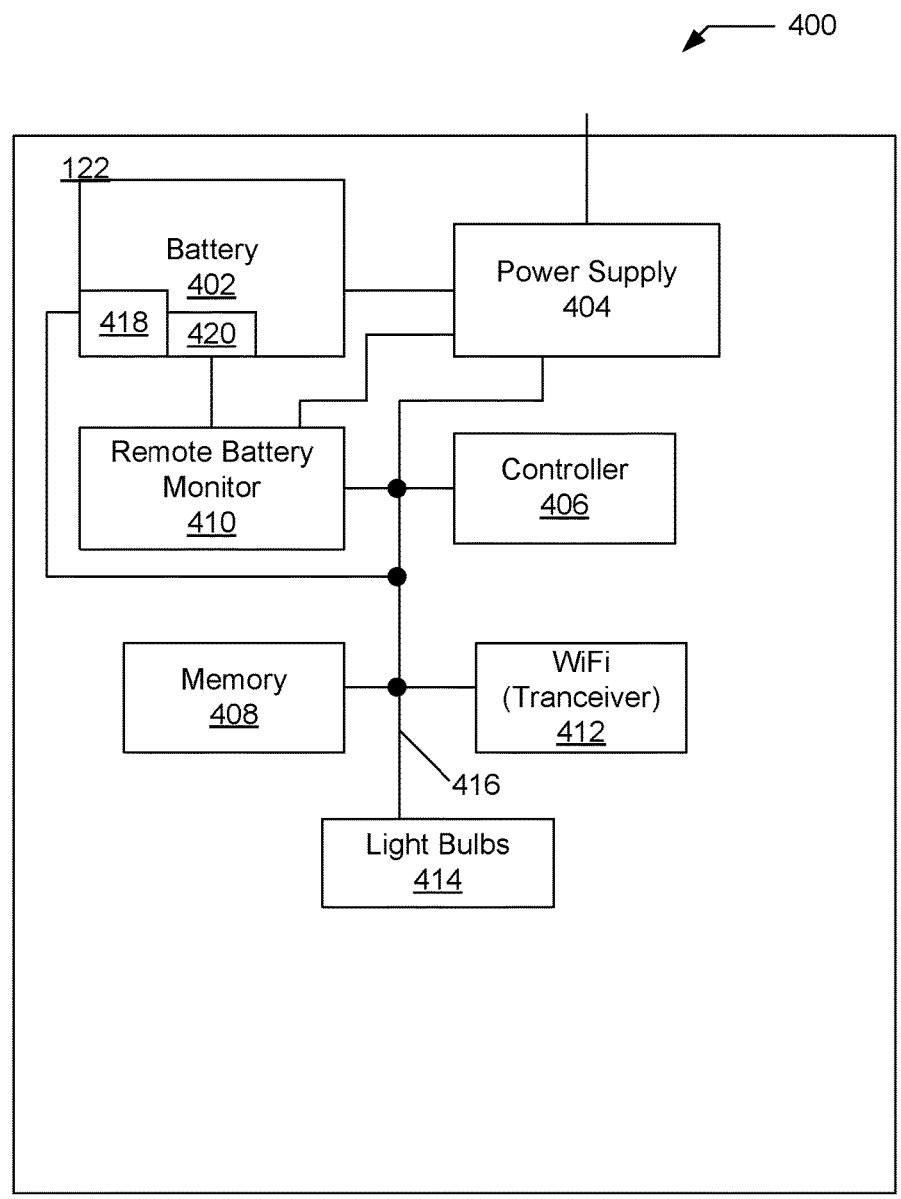
FIG. 4 shows an exemplary block diagram of an emergency light having a backup battery in the building network of FIG. 2 in accordance with an example implementation.

Turning to FIG. 4, shows an exemplary block diagram 400 of an emergency light 122 having a battery 402 in the building 200 of FIG. 2 in accordance with an example implementation. The emergency light 122 is a smart device and includes a battery 402, power supply 404, controller 406, memory 408, remote battery monitor 410, wireless network transceiver (WiFi) 412, light bulbs 414, and data/power bus 416. The controller 406 is a microprocessor in the current implementation and is coupled to power supply 404, memory 408, remote battery monitor 410, WiFi 412 and light bulbs 414 via the data/power bus 416. In other implementations, the data and power bus may be separate buses.

The controller 406 may also be coupled to the battery and access memory 418 associated with the battery 402, such as EEPROM,ROM memory, or readable barcode/UPC type label that contains battery information such as manufacturer, date of manufacture, voltage, and amp ratings. The battery information would preferably be written into the battery memory 418 during the manufacturing of the battery. In other implementations, the controller 406 may access the battery memory via the remote battery monitor that is coupled to the battery 402. The accessed battery information is written into memory 408 by the controller 406.

In operation, the emergency light 122 receives line power (110V AC or in other implementations other voltages such as 220V AC) at the power supply 404. The power supply typically converts the line power to DC power for powering the circuits (controller 406, remote battery monitor 410, memory 408, and WiFi 412, and light bulbs 414) of the emergency light 122. The power supply 404 also is able charge the battery 402. If the line power is interrupted, the battery 402 powers the circuit and operation of the emergency light 122 is not interrupted. When line power is restored, the battery 402 is charged to full capacity. The condition of the battery 402 may be monitored by the remote battery monitor 410. The remote battery monitor 410 may gather battery operational data associated with the operating state the battery 402 and condition of battery 402 with battery sensor 420. Examples of battery sensors include one or more gas sensors, one or more temperature sensors, one or more battery voltage sensors, and other sensors that gather data associated with the battery. The battery operation data may be periodically (12 hours in the current implementation but may be configurable in other implementations) transmitted via the controller 406 and WiFi 412 to a workstation 202 in the BAS 100 for logging and further analysis.

Figure 5:
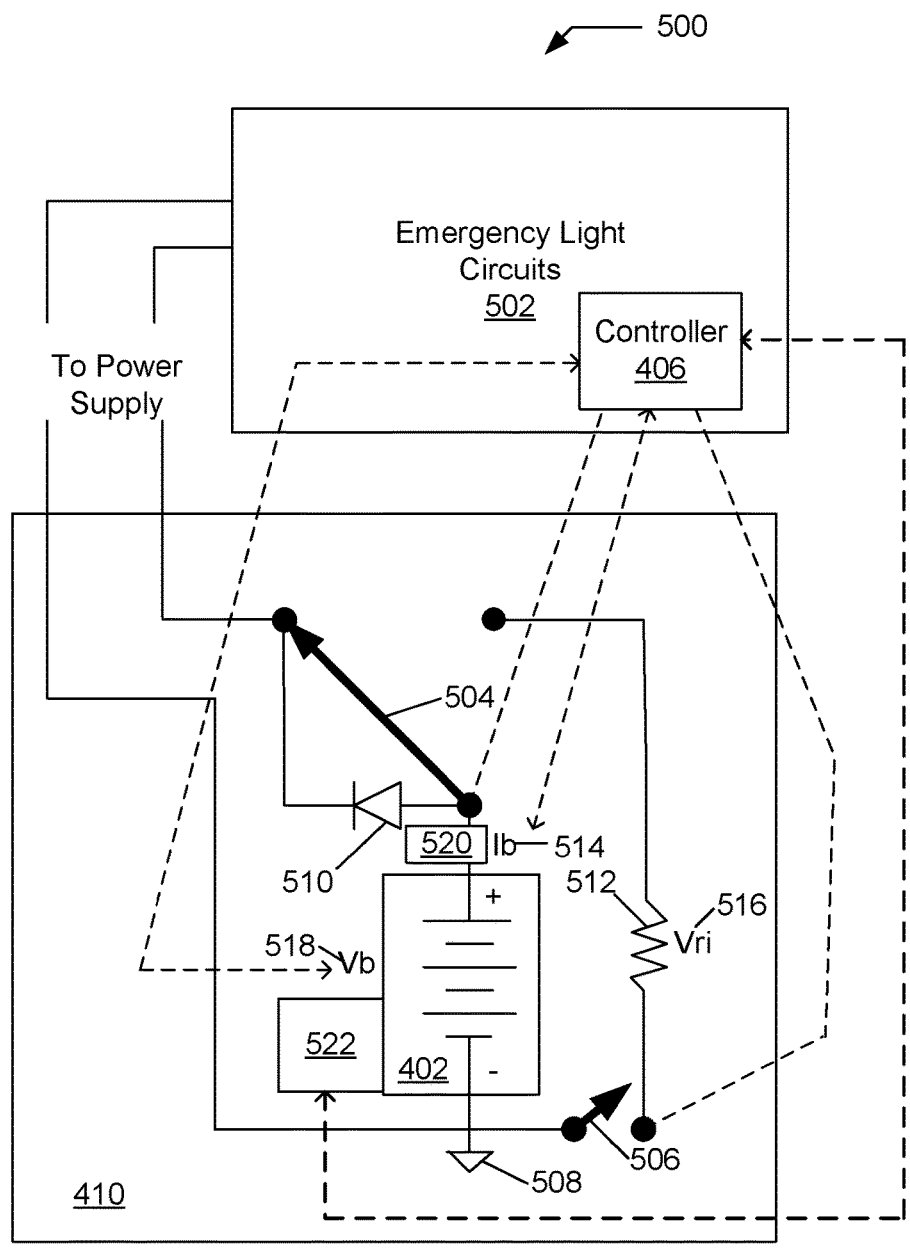
FIG. 5 is a diagram of the remote monitoring circuit found in the emergency light of FIG. 4 in accordance with an example implementation.

In FIG. 5, a circuit diagram 500 of the remote battery monitor circuit 410 found in the emergency light 122 of FIG. 4 is depicted in accordance with an example implementation. The emergency light circuits 502 (other components coupled to data/power bus 416 of FIG. 4) is depicted in a simplified circuit diagram that highlights the operation of the in circuit monitoring of the battery 402. Two switches 504 and 506 are depicted and are controlled by controller 406. In practice, these switches may be implemented as solid state switching transistors rather than mechanical switches. When the switches 504 and 506 are in a first position, the remote battery monitor circuit. 410 allows current to flow into or out of the battery 402 as needed by the emergency light 122. The controller is able to measure the current Ib 514 with current sensing element 520 when the switches 504 and 506 are in the first position measuring current going out of the battery or into the battery (being charged). When the switches are placed in a second position by the controller 406, the voltage Vri 516 across resistor 512 creates a measurable current Ib 514 flowing to ground 508 that is measured by the current sensing element 520 with the resistance of resistor 512 being known or predetermined. A diode 510 prevents current from flowing in the reverse direction when the switches 504 and 506 are in the second position. The controller 406 is also able to collect sensor data associated with the battery 402, such as the temperature of the battery using the battery temperature sensing element 522 and other sensor data from sensors 420 of FIG. 4. The sensor data provides operational information and charging information about the battery's condition.

Battery information that measured with the remote battery monitor 410 may be transmitted by the controller to a workstation (such as 202 or local server/cloud server 112). The battery information may include current draw, voltage Vri 516, Ib current 514, Vb voltage 518 (measured by a voltage sensor that is one of the sensors represented by sensors 420 of FIG. 4), battery temperature (from battery sensor element 522), manufacturer of the battery, age of the battery, number of deep discharges, etc. . . . This battery information may be log and historic analysis conducted on the battery information. Such analysis may indicate trends that may lead to failure of the or loss of capacity. The workstation may process the data and generate alerts or alarms for batteries that are failing or predictions of when batteries may need to be replaced. It is also possible to collect data from multiple installations using back-up batteries that are being monitored and generate brand specific metrics including lifecycle measurements. The amp-hour capacity is also monitored by the remote battery monitor 410. Thus enabling actually characteristics of different brands of batteries to be identified.

Alerts may also be generated based on the manufacturing date of the battery and/or installation date of the battery in accordance with a predetermined maintenance schedule. The alerts may be send as text messages or emails to BAS 100 engineers and/or generate visual or audio alarms located remotely or on the actually devices.

By remote monitoring of the batteries the undesirable condition of low battery voltage cut-off occurring can be eliminated. For example, in a 24V DC powered system low battery cut-off is triggered in some implementations at 19.5-19.6 volts direct current (DC). In the event of a catastrophic power failure and the battery was at 19.7 volts DC just prior to the failure, the device or system would have limited operational battery capacity. Thus, an alarm system might go silent after only a short period and not he available for first responders.

Different types of batteries have different types of charging and discharging characteristics. These characteristics are also dependent upon the system and type of load the battery experiences. Thus, a battery may be identified by the remote battery monitor 410 and then the remote battery monitor may automatically adapt for that type of battery. In the current example, the battery 402 is identifiable by the remote battery monitor 410 by receiving or reading the battery identification information associated or contained with the battery in memory 418. That battery information may then be used by the controller 406 to access the network via WiFi 412 and search the internet (World Wide Web) for information(battery setup data) associated with the use (charging/discharging, life cycle, and other miscellaneous information). That information is then received by the controller 406 and the remote battery monitor 410 is configured using the received data. In other implementations, a specific website may exist for a repository for battery configuration information. That website may also be a repository of operational battery data uploaded from multiple installations or BASs.

The configuration of the remote battery monitor 410 using received battery setup data may result in resistor value of resistor 512 to be digitally selected (when resistor 512 is a digitally controlled variable resistor) or analog selected (when resistor 512 is a potentiometer with a variable resistance controllable by controller 406). Similarly, cut-off voltages and currents may be selected based upon battery setup information.

Figure 6:
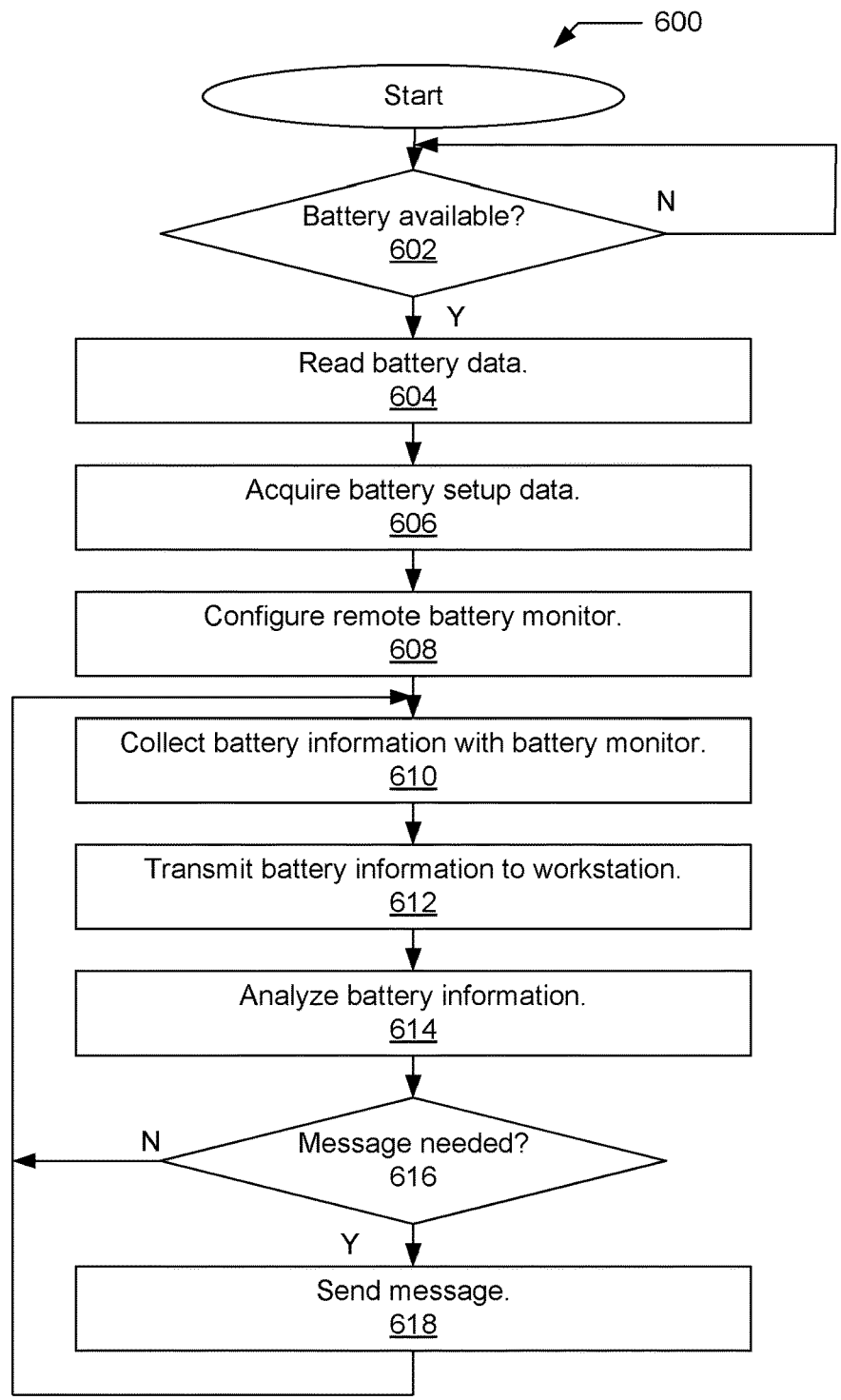
FIG. 6 is a flow diagram for the approach of the remote monitoring of a battery in the emergency light of FIG. 4 in accordance with an example implementation.

FIG. 6 is a flow diagram 600 for the approach of the remote monitoring of a battery in the emergency light 122 of FIG. 4 in accordance with an example implementation. A check is made by the remote battery monitor 410 to verify that the battery 402 is connected in the emergency light 112 in step 602. The remote battery monitor 410 reads the memory 418 associated with the battery 402 and retrieves the battery identification in step 604. Using the battery identification, the remote battery monitor 410 accesses the network (internet/World Wide Web) to find and acquire battery setup date in step 606. Once the battery setup data is acquired by the remote battery monitor 410, the remote battery monitor 410 is configured for operation with the battery 402 in step 608.

Once the remote battery monitor 410 is configured, it monitors the operation of the battery 402 and collects battery information in step 610 that is stored in local memory 408. The collected battery information is transmitted to the workstation 202 periodically in step 612. In step 614 the workstation 202 analyzes the current and historic battery information and determines in step 616 if messages or alarms need to be triggered or sent. If messages need to be sent in step 616 then messages are sent in step 618. Otherwise processing continues at step 610. If the battery is not available in step 602 processing returns to step 602 checking for the battery.

In other implementations, the battery may be identified via a graphical user interface, such as user interface 308 of field panel 208. In yet other implementations, multiple batteries may be monitored rather than a single battery.

While the BIS application and remote battery monitor 410 is described as being implemented as software executed by a device with a processor (i.e., as a combination of hardware and software), the embodiments presented may be implemented in hardware alone such as in an application-specific integrated circuit ("ASIC") device.

The flow diagrams of FIG. 6 may be implemented in hardware, software, or a combination of hardware and software. The software is a plurality of non-transitory machine readable instructions that may be loaded into a memory, such as RAM, ROM, SDRAM, DIMMS, or there types of digital memory and execute via a processor or controller. The software may be accessed from punch cards, magnetic tape, magnetic disks, compact discs (CDs), digital video discs (DVDs), or other non-transitory storage devices and loaded into memory or executed from the non-transitory storage, The remote battery monitor has been described with respect to a building automation system. Other uses for the remote battery monitor include and are not limited to monitoring backup batteries in any type of system or device that is network capable. Industries and other applications that could make use of a secure machine readable code include automotive and home automation systems.

The foregoing detailed description of one or more embodiments of the secure machine readable code has been presented herein by way of example only and not limitation. It will he recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. A remote battery monitor for monitoring a battery, comprising:
   a memory;
   a transceiver;
   a current sensing element;
   at least one sensor; and
   a controller coupled to the memory, the transceiver, the current sensing element, and the at least one sensor, where the at least one sensor is a gas sensor, where the current sensing element is able to measure current going into or out of the battery and that can switch the battery out of a circuit and connect the battery to a predetermined resistance of the remote battery monitor in response to a request from the controller where a voltage from the battery to the circuity and to the predetermined resistance is the same prior to and where battery data generated by the current sensing element and the at least one sensor is formatted for transmission by the transceiver.

2. The remote battery monitor of claim 1, including battery setup information received at the transceiver for the battery in response to a battery configuration information request made by the controller.

3. The remote battery monitor of claim 2, where the controller is in receipt of battery identification information from the battery and requests battery setup information via the transceiver.

4. The remote battery monitor of claim 2, where the predetermined resistance is identified in the battery configuration information.

5. The remote battery monitor of claim 1, further comprising at least one additional sensor that is a battery temperature sensing element.

6. The remote battery monitor of claim 1, where the controller sends the battery data periodically.

7. The remote battery monitor of claim 1, where the controller sends a message in response to the at least one sensor.

8. The remote battery monitor of claim 1, where the controller sends a message in response to the current sensing element.

9. A method of remote battery monitoring of a battery connected to a circuit, comprising: measuring a current flowing into and out of the battery with a current sensing element resulting in current data, where a switch switches the battery out of the circuit and connects the battery to a predetermined resistance of a remote battery monitor where a voltage from the battery to the circuity and to the predetermined resistance is the same in response to a request from a controller of the remote battery monitor to generate the current; generating sensor data with at least one sensor, where the at least one sensor is a gas sensor; storing the sensor data and current data as battery data in a memory of the remote battery monitor; and transmitting the battery data with a transceiver of the remote battery monitor in response to the request from the controller which is formatted by the remote battery monitor for reception by a server.

10. The method of remote battery monitoring of claim 9, which includes configuring the controller for the battery in response to receipt of battery setup information at the transceiver.

11. The method of remote battery monitoring of claim 10, receiving battery setup information at the controller from the battery identification information, and requesting battery configuration information via the transceiver.

12. The method of remote battery monitoring of claim 10, further including identifying the predetermined resistance in the battery setup information.

13. The method of remote battery monitoring of claim 9, further comprising at least one additional sensor that is a battery temperature sensing element.

14. The method of remote battery monitoring of claim 9, further including sending the operational battery data periodically.

15. The method of remote battery monitoring of claim 9, where the transceiver sends a message requested by the controller in response to the current sensed by the current sensing element.

16. A remote battery monitoring system, comprising:
   a memory;
   a transceiver;
   a current sensing element;
   at least one sensor;
   a controller coupled to the memory, the transceiver, the current sensing element, and the at least one sensor, where the at least one sensor is a gas sensor, where the current sensing element is able to measure current going into or out of the battery and switch the battery out of a circuit and connect the battery to a predetermined resistance of the remote battery monitor in response to a request from the controller where a voltage from the battery to the circuity and to the predetermined resistance is the same and where battery data generated by the current sensing element and the at least one sensor is formatted for transmission by the transceiver to a server; and a server in receipt of the battery data stores the battery data and analyzes the stored battery data with historical battery data and generates a periodic report of analyzed battery data.

17. The remote battery monitoring system of claim 16, including configuration of the controller for the battery in response to receipt of battery setup information at the transceiver.

18. The remote battery monitoring system of claim 17, where the controller is in receipt of battery identification information from the battery and request battery configuration information via the transceiver.

19. The remote battery monitoring system of claim 17, where the predetermined resistance is identified in the battery setup information.

20. The remote battery monitoring system of claim 16, further comprising at least one additional sensor that is a battery temperature sensing element.

21. The remote battery monitoring system of claim 16, where the controller sends the operational battery data periodically.

* * * * *